US009728930B2

(12) United States Patent
Williams et al.

(10) Patent No.: US 9,728,930 B2
(45) Date of Patent: Aug. 8, 2017

(54) QUANTUM CASCADE EXTERNAL CAVITY LASER WITH METASURFACES

(71) Applicant: THE REGENTS OF THE UNIVERSITY OF CALIFORNIA, Oakland, CA (US)

(72) Inventors: Benjamin Stanford Williams, Los Angeles, CA (US); Luyao Xu, Los Angeles, CA (US); Daguan Chen, Los Angeles, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 15/264,509

(22) Filed: Sep. 13, 2016

(65) Prior Publication Data
US 2017/0077667 A1    Mar. 16, 2017

Related U.S. Application Data

(60) Provisional application No. 62/218,482, filed on Sep. 14, 2015.

(51) Int. Cl.
| | |
|---|---|
| *H01S 3/10* | (2006.01) |
| *H01S 3/08* | (2006.01) |
| *H01S 5/024* | (2006.01) |
| *H01S 5/34* | (2006.01) |
| *H01S 5/343* | (2006.01) |
| *H01S 5/14* | (2006.01) |
| *H01S 5/068* | (2006.01) |

(52) U.S. Cl.
CPC ...... *H01S 3/08059* (2013.01); *H01S 3/08054* (2013.01); *H01S 5/02407* (2013.01); *H01S 5/02469* (2013.01); *H01S 5/06821* (2013.01); *H01S 5/14* (2013.01); *H01S 5/3401* (2013.01); *H01S 5/34313* (2013.01)

(58) Field of Classification Search
CPC ............ H01S 3/08059; H01S 5/02407; H01S 5/06821; H01S 5/02469; H01S 5/3401; H01S 3/08054; H01S 3/08
USPC ......................................................... 372/20
See application file for complete search history.

(56) References Cited

U.S. PATENT DOCUMENTS

| | | | | |
|---|---|---|---|---|
| 7,272,158 | B1 * | 9/2007 | Hayes ................. | G02F 1/365 |
| | | | | 372/21 |
| 2013/0266034 | A1 * | 10/2013 | Yu .................... | B82Y 20/00 |
| | | | | 372/27 |
| 2013/0294467 | A1 * | 11/2013 | Moloney ............. | H01S 3/10 |
| | | | | 372/20 |

OTHER PUBLICATIONS

Amanti et al., "Low Divergence Terahertz Photonic-Wire Laser," Opt. Express 18, pp. 6390-6395 (2010).
Amanti et al., "Low-Divergence Single-Mode Terahertz Quantum Cascade Laser," Nature Photonics 3, pp. 586-590 (2009).

(Continued)

*Primary Examiner* — Tuan Nguyen
(74) *Attorney, Agent, or Firm* — Foley & Lardner LLP; Cliff Z. Liu

(57) ABSTRACT

A metasurface reflector for quantum cascade lasing is disclosed. The metasurface reflector uses an array of subcavities disposed on a substrate and spaced with a sub-wavelength period. Each of the subcavities includes a layer of quantum-cascade-laser-active material sandwiched between two metallic layers. The array of subcavities reflect an incident light of a resonant frequency with amplification. When used with an output coupler, a quantum cascade laser beam can be generated.

22 Claims, 13 Drawing Sheets

(56) References Cited

OTHER PUBLICATIONS

Botez et al., Diode Laser Arrays, (Cambridge University Press, New York, 1994), 5 pages.
Brandstetter et al., "High Power Terahertz Quantum Cascade Lasers With Symmetric Wafer Bonded Active Regions," Appl. Phys. Lett. 103, 171113, 6 pages, (2013).
Chassagneux et al., "Graded Photonic Crystal Terahertz Quantum Cascade Lasers," Appl. Phys. Lett. 96, 031104, 4 pages, (2010).
Defreez et al., "Spectral and Picosecond Temporal Properties of Flared Guide Y-Coupled Phase Locked Laser Arrays," Appl. Phys. Lett. 53, pp. 2380-2382 (1988).
Hon et al., "Radiation Model for Terahertz Transmission-Line Metamaterial Quantum-Cascade Lasers," IEEE Trans. Terahertz Science and Technology 2, pp. 323-332 (2012).
Jenkins et al., "Terahertz Kerr and Reflectivity Measurements on the Topological Insulator Bi2Se3," Physical Review B 82, pp. 125120-1 to 125120-9 (2010).
Kao et al., "Perfectly Phase-Matched Third-Order Distributed Feedback Terahertz Quantum-Cascade Lasers," Opt. Lett. 37, pp. 2070-2072 (2012).
Kao et al., "Phase-Locked Arrays of Surface-Emitting Terahertz Quantum-Cascade Lasers," Appl. Phys. Lett. 96, 101106, 4 pages, (2010).
Kohen et al., "Electromagnetic Modeling of Terahertz Quantum Cascade Laser Waveguides and Resonators," J. Appl. Phys. 97, 053106, 9 pages, (2005).
Li et al., "Terahertz Quantum Cascade Lasers With >1W Output Powers," Electron. Lett. 50, pp. 309-311(2014).
Liu et al., "Terahertz Polarization Imaging Based on the Continuous Wave Terahertz Radiations," Proc. SPIE 9622, 962209, 8 pages, (2015).
Morris et al., "Polarization Modulation Time-Domain Terahertz Polarimetry," Opt. Express 20, pp. 12303-12317 (2012).
Rudin et al., "Highly Efficient Optically Pumped Vertical-Emitting Semiconductor Laser With More Than 20 W Average Output Power in a Fundamental Transverse Mode," Opt. Lett. 33, pp. 2719-2721 (2008).
Stokes et al., "Development of a QCL based IR polarimetric system for the stand-off detection and location of IEDs," Proc. SPIE 7486, 748609, 13 pages, (2009).
Tavallaee et al., "Terahertz Quantum-Cascade Laser With Active Leaky-Wave Antenna," Appl. Phys. Lett. 99, 141115, 4 pages, (2011).
Tropper et al., "Extended Cavity Surface-Emitting Semiconductor Lasers," Progress in Quantum Electronics 30, pp. 1-43 (2006).
Tropper et al., "Vertical-External-Cavity Semiconductor Lasers," J. Phys. D: Appl. Phys. 37, R75-R85 (2004).
Tyo, et al., "Target Detection in Optically Scattering Media by Polarization-Difference Imaging," Appl. Opt. 35, pp. 1855-1870 (1996).
Williams, B. S., "Terahertz Quantum Cascade Lasers," Nature Photonics 1, pp. 517-524 (2007).
Xu G., et al., "Efficient Power Extraction in Surface-Emitting Semiconductor Lasers Using Graded Photonic Heterostructures," Nat Commun 3, 952, 7 pages, (2012).
Xu J. et al., "Terahertz Circular Dichroism Spectroscopy: A Potential Approach to the in Situ Detection of Life's Metabolic and Genetic Machinery," Astrobiology 3, pp. 489-504 (2003).
Xu, L. et al., "Metasurface External Cavity Laser," Applied Physics Letters, 2015, vol. 107, pp. 221105-1 to 221105-5.
Xu, J. et al., "Tunable Terahertz Quantum Cascade Lasers With an External Cavity," Appl. Phys. Lett. 91, 121104, 4 pages, (2007).
Xu, L. et al., "Terahertz Quantum Cascade VECSEL," Proc. SPIE 9734, 97340G, 6 pages, (2016).

* cited by examiner

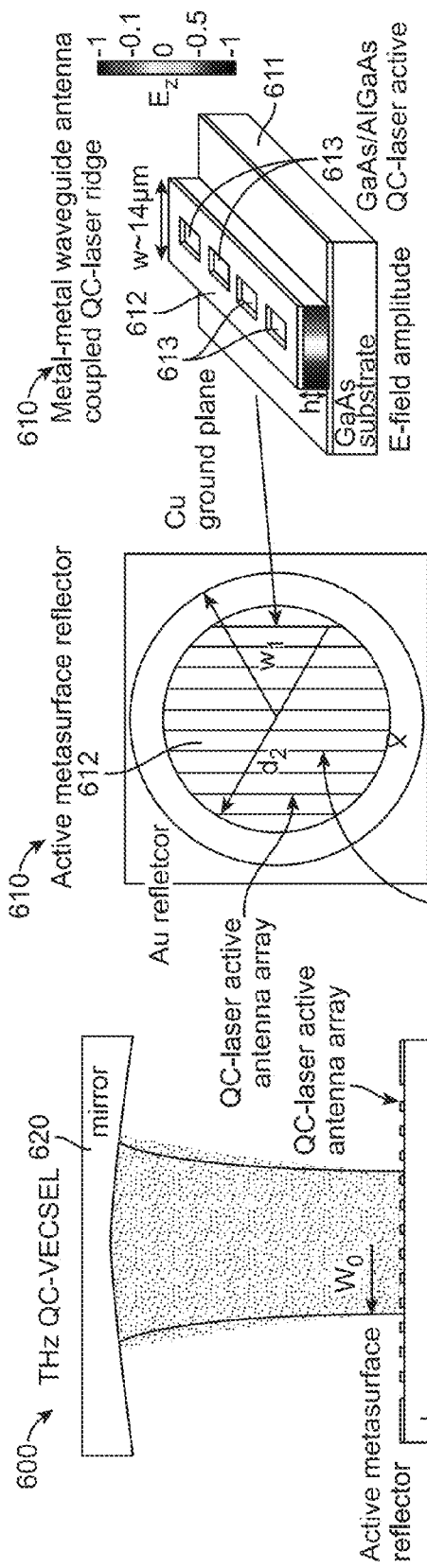
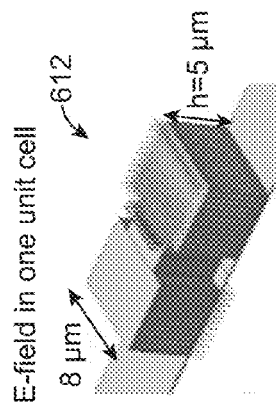
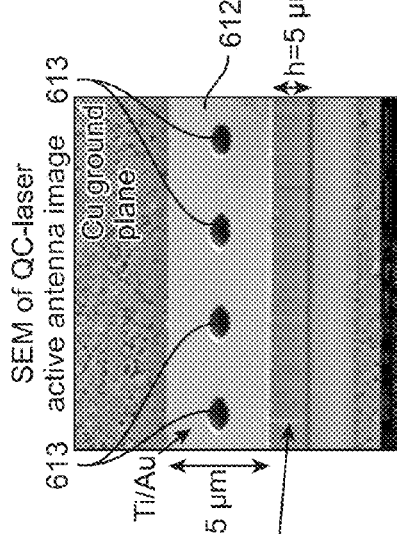
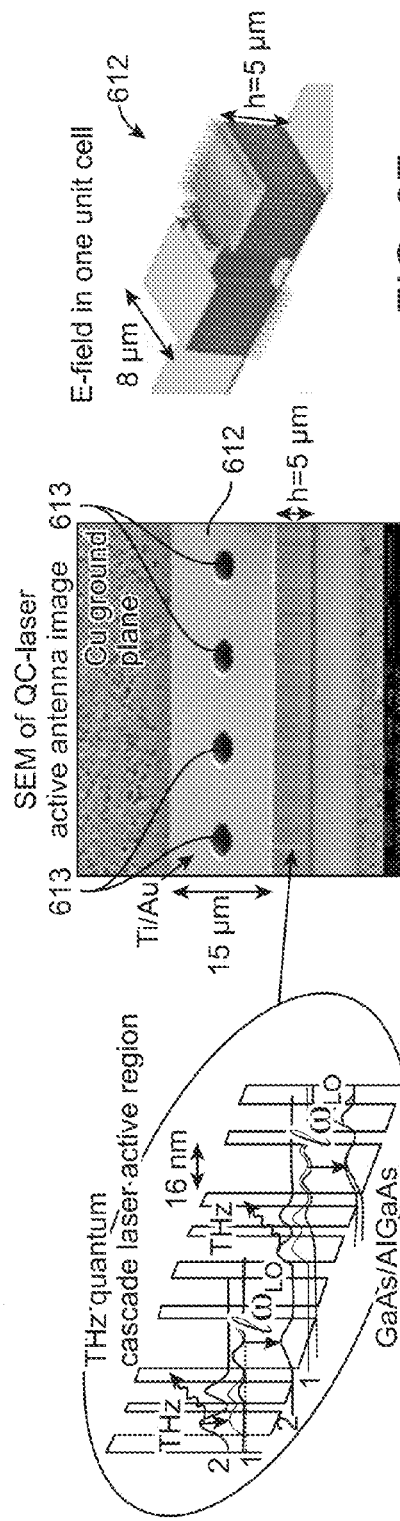
FIG. 6A
FIG. 6B
FIG. 6C
FIG. 6D
FIG. 6E
FIG. 6F 11(a)
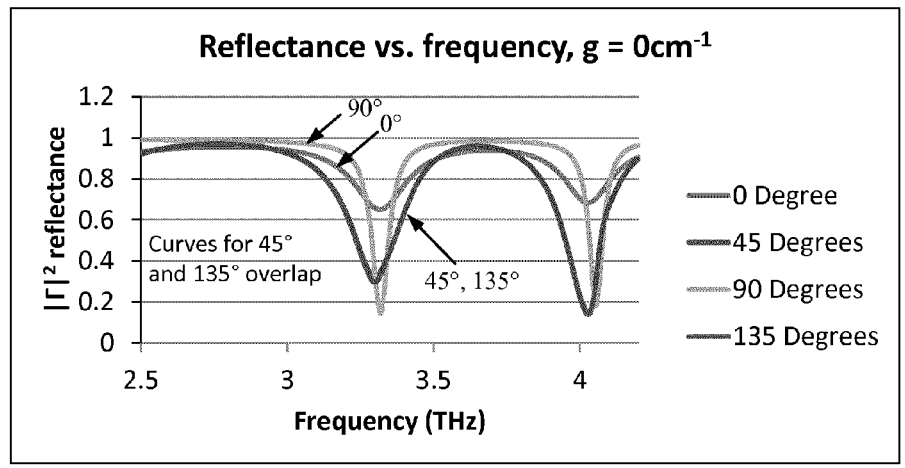
11(b)
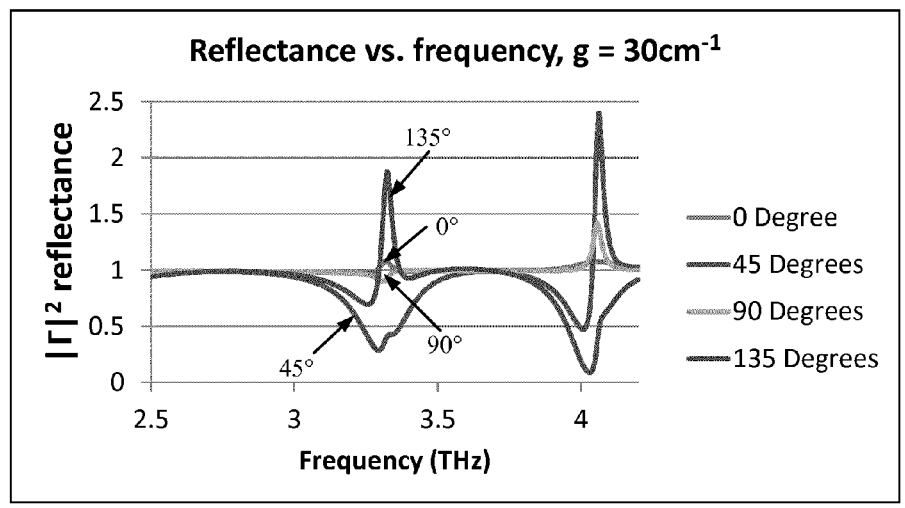
11(c)
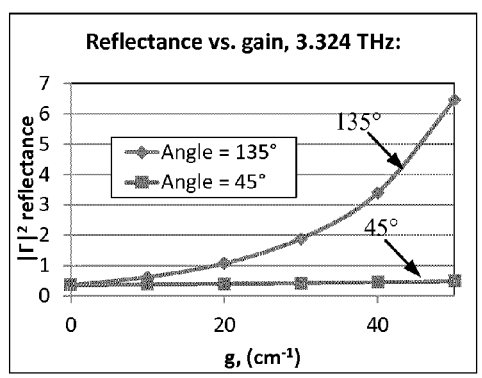
11(d)
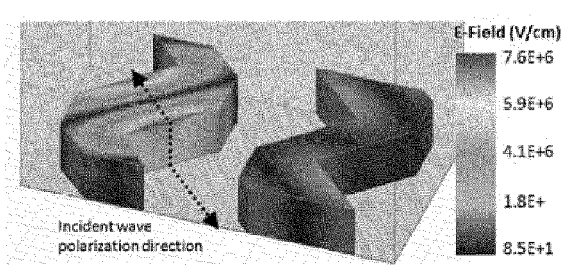
FIG. 11

QUANTUM CASCADE EXTERNAL CAVITY LASER WITH METASURFACES

CROSS-REFERENCE TO RELATED APPLICATION

This application claims the benefit of U.S. Provisional Application No. 62/218,482 filed on Sep. 14, 2015, the content of which is incorporated herein by reference in its entirety.

STATEMENT REGARDING FEDERALLY SPONSORED RESEARCH OR DEVELOPMENT

This invention was made with Government support under 1407711, awarded by the National Science Foundation. The Government has certain rights in the invention.

BACKGROUND

Terahertz quantum cascade (QC) lasers generally use sub-wavelength metallic and/or plasmonic waveguiding techniques, which can lead to divergent poor-quality beams. Achieving a high quality beam, such as symmetric, directive, diffraction-limited, and non-astigmatic, is thus a challenge for QC lasers. The scheme of vertical external cavity surface emitting laser (VECSEL) has been a solution for some types of semiconductor lasers. In a typical VECSEL configuration, a quantum well (or dot) of semiconductor active medium is grown monolithically with a distributed Bragg reflector. When optically pumped over a large area, the semiconductor medium forms an active reflector as part of an external laser cavity, which can be readily engineered to support solely or primarily the fundamental Gaussian mode so as to provide a circular output beam with diffraction-limited beam quality—even for high powers. However, a conventional design of surface emission seems to be incompatible with QC lasers. In a QC laser, the optical gain is based upon intersubband transitions of electrons within planar quantum wells. These transitions obey a "intersubband selection rule" by which solely or primarily light with the electric field polarized along the growth direction of the wells can be emitted. Therefore, the conventional design of VECSEL cannot be readily implemented for QC lasers since the polarization of light in the cavity would not couple with the QC gain transitions.

Currently, Bragg scattering is used to redirect the in-plane radiation of terahertz QC lasers to achieve more directive surface emitting beams. For example, $2^{nd}$ order distributed feedback (DFB) cavities and photonic crystal (PhC) cavities have been used for surface emission in QC lasers which resulted in about 9°×6° divergence; $3^{rd}$ order DFB cavities have been used for end-fire emission in QC lasers which resulted in a 6°×11° divergence. The $2^{nd}$ order DFB and PhC cavities use surface emitting Bragg laser cavities to obtain a large radiating aperture for good beam quality. Further decreasing the beam divergence along both axes involves either on-chip phase locking between large numbers of $2^{nd}$ order DFB array elements, which adds complexity and might cause side lobes in the beam pattern due to the grating diffraction (array ridges' width is usually larger than the free-space wavelength), or a large PhC cavity dimension, which degrades the temperature performance. The $3^{rd}$ order DFB cavities operate as end-fire antennas, which allow a directive beam (e.g., far-field divergence of about 10°) from a laser ridge with subwavelength transverse dimensions. However, since the beam divergence from a $3^{rd}$ order DFB laser scales with a square root of the ridge length L (i.e., $L^{-1/2}$), improvement in beam directivity might involve inconveniently long ridges (e.g., a 6°×11° far-field was achieved using a 5.7 mm long ridge), which are subject to spatial hole burning and become increasingly difficult to phase match. It is against this background that a need arose to develop the embodiments described in this disclosure.

SUMMARY

In some embodiments, a metasurface reflector for quantum cascade lasing includes a substrate and an array of subcavities disposed on the substrate and spaced with a period. Each of the subcavities includes: a first metallic layer disposed on the substrate; a layer of quantum-cascade-laser-active material disposed on the first metallic layer; and a second metallic layer disposed on the layer of quantum-cascade-laser-active material. The array of subcavities reflect an incident light of a resonant frequency with amplification. For example, a reflectance of the array of subcavities is more than unity (1) at a gain peak of the layer of quantum-cascade-laser-active material. The period of the array of subcavities is less than a wavelength of the incident light of the resonant frequency.

In some embodiments, the substrate comprises a GaAs substrate, and the layer of quantum-cascade-laser-active material comprises a GaAs/AlGaAs material system or a InGaAs/InAlAs material system.

In some embodiments, a gain peak of the layer of quantum-cascade-laser-active material is in a range of about 1 Terahertz (THz) to about 10 THz. In further embodiments, the gain peak is in a range of about 2 THz to about 3 THz.

In some embodiments, a width of each subcavity substantially determines cutoff of the resonant frequency. For example, a width of each subcavity is in a range of about 10 micrometer (μm) to about 15 μm, a height of each subcavity is in a range of about 5 μm to about 20 μm, and the period of the array is in a range of about 50 μm to about 100 μm.

In some embodiments, each subcavity tapers at edges of the metasurface reflector and terminates at an unbiased region of the metasurface reflector.

In some embodiments, the metasurface reflector is polarimetric. In particular, the array of subcavities include a first group of subcavities and a second group of subcavities interlaced with each other. The first group of subcavities selectively reflects first incident light of a first polarization state with amplification. The second group of subcavities selectively reflects second incident light of a second polarization state with amplification. The first and second polarization states are different and can be one of a linear polarization, a right-hand circular polarization, or a left-hand circular polarization. In further embodiments, the first polarization state and the polarization state are orthogonal to each other. In further embodiments, each of the first group of subcavities includes a plurality of parallel first patches electrically connected by a plurality of first connectors, wherein each of the second group of subcavities includes a plurality of parallel second patches electrically connected by a plurality of second connectors, and wherein the first patches and the second patches have different orientations.

In some embodiments, a metasurface reflector for quantum cascade lasing includes (1) a substrate; (2) a first metallic layer (or another first cladding layer) disposed on the substrate; (3) an array of strips of a quantum-cascade-laser-active material and spaced with a period, the array of strips being disposed on the first metallic layer such that a first portion of the first metallic layer is covered by the array and a second portion of the first metallic layer is exposed from the array; and (4) a second metallic layer (or other second cladding layer) disposed on the array of strips of the quantum-cascade-laser-active material. The metasurface reflector reflects an incident light of a resonant frequency with amplification. For example, a reflectance of the metasurface reflector is more than unity (1) at a gain peak of the layer of quantum-cascade-laser-active material. The period of the array of strips is less than a wavelength of the incident light of the resonant frequency.

In some embodiments, a quantum cascade laser includes a metasurface reflector and an output coupler coupled to the metasurface reflector which forms an external cavity with the metasurface reflector for generating a quantum cascade laser beam. The metasurface reflector includes a substrate and an array of subcavities disposed on the substrate and spaced with a period. Each of the subcavities includes: a first metallic layer disposed on the substrate; a layer of quantum-cascade-laser-active material disposed on the first metallic layer; and a second metallic layer disposed on the layer of quantum-cascade-laser-active material. The array of subcavities reflect an incident light of a resonant frequency with amplification. For example, a reflectance of the array of subcavities is more than unity (1) at a gain peak of the layer of quantum-cascade-laser-active material. The period of the array of subcavities is less than a wavelength of the incident light of the resonant frequency.

In some embodiments, the gain peak of the layer of quantum-cascade-laser-active material is in a range of about 1 THz to about 10 THz.

In some embodiments, the quantum cascade laser further includes a heat sink that holds the metasurface reflector, and a cryostat that houses the heat sink and the metasurface reflector, wherein the cryostat includes a window for transmission of the quantum cascade laser beam.

In some embodiments, the output coupler is an external reflector. The quantum cascade laser beam is reflected between the external reflector and the metasurface reflector before emitting. In further embodiments, the output coupler is a THz wire-grid polarizer. An output power of the quantum cascade laser is adjusted by varying the wire orientation angle on the THz wire-grid polarizer.

In some embodiments, the external cavity is a plano-plano Fabry-Perot cavity, and wherein a configuration of the output coupler determines a spectrum of the quantum cascade laser beam. In further embodiments, the quantum cascade laser beam is a Gaussian mode laser beam with a divergence of about 4.3°×5.1° or lower.

In some embodiments, the quantum cascade laser is polarimetric. In particular, the array of subcavities include a first group of subcavities and a second group of subcavities interlaced with each other. The first group of subcavities selectively reflects first incident light of a first polarization state with amplification. The second group of subcavities selectively reflects second incident light of a second polarization state with amplification. The first and second polarization states are different and can be one of a linear polarization, a right-hand circular polarization, or a left-hand circular polarization. In further embodiments, the first polarization state and the polarization state are orthogonal to each other. In further embodiments, each of the first group of subcavities includes a plurality of parallel first patches electrically connected by a plurality of first connectors, wherein each of the second group of subcavities includes a plurality of parallel second patches electrically connected by a plurality of second connectors, and wherein the first patches and the second patches have different orientations.

BRIEF DESCRIPTION OF THE DRAWINGS

The accompanying drawings, which are incorporated herein and constitute part of this specification, illustrate example embodiments of the disclosure, and together with the general description given above and the detailed description given below, serve to explain the features of the various example embodiments.

FIG. 6(a) is a schematic diagram of a THz QC VECSEL based on a metasurface reflector, according to another embodiment.

FIG. 6(b) is a schematic diagram of a metasurface reflector with an array of subcavities, according to an embodiment.

FIG. 6(c) is a schematic diagram of an individual subcavity used in the metasurface reflector, according to an embodiment.

FIG. 6(d) is a schematic diagram of a resonant phonon QC laser active region, according to an embodiment.

FIG. 6(e) is an SEM image of a subcavity used in a metasurface reflector, according to an embodiment.

FIG. 6(f) is a picture of simulated electric field vectors in a unit cell of a subcavity, according to an embodiment.

FIG. 11(a) is a graph of reflectance spectra at a medium gain of g=0 cm$^{-1}$ for the metasurface reflector of FIG. 10 for a set of different polarization angles of incident waves, according to an embodiment.

FIG. 11(b) is a graph of reflectance spectra at a medium gain of g=30 cm$^{-1}$ for the metasurface reflector of FIG. 10 for a set of different polarization angles of incident waves, according to an embodiment.

FIG. 11(c) is a graph of reflectance at resonant frequency vs. medium gain for the metasurface reflector of FIG. 10 for incident wave polarization angles of 45° and 135°, according to an embodiment.

FIG. 11(d) is a picture of the electric field distribution in a patch of the first group and a patch of the second group, when a 3.324 THz wave polarized at 135° is incident on the metasurface and a gain is applied to the first group of subcavities, according to an embodiment.

DESCRIPTION

Embodiments of this disclosure are directed to an improved device, a quantum cascade (QC) vertical external cavity surface emitting laser (VECSEL), that achieves scalable output power, high quality diffraction limited, directive output beams. The QC external cavity laser uses a metasurface reflector, which is composed of an array of sub-wavelength subcavities to provide the gain of the laser. Each subcavity includes a layer of quantum-cascade-laser-active material sandwiched between two cladding metallic layers, which constitutes a metal-metal waveguide. The subcavity couples surface incident radiation to the quantum-cascade gain medium and acts as an antenna to radiate in the surface direction. Thus, the metasurface reflector is also called "active metasurface reflector" or "metasurface," and the subcavity is also called "waveguide," "metal-metal waveguide," or "antenna" in this disclosure. Lasing oscillation may be generated when the metasurface reflector is placed into a low loss external cavity, where the external cavity determines the mode and resulting beam properties. Using a wire-grid polarizer as an output coupler (e.g., an external reflector), a near-Gaussian beam of low divergence (e.g., about 4.3°×5.1° divergence) may be achieved. The output coupling efficiency is continuously tunable with the polarizer's orientation and an output power level >about 5 mW, or even a Watt level output power, may be achieved.

In addition, a QC laser with switchable polarization can be achieved on the QC VECSEL composed of the metasurface reflector. In particular, the metasurface reflector includes two groups of subcavities interlaced with each other, each group selectively responsive to incident waves of a corresponding polarization state. The subcavities are set up such that electrical current injection can be applied to either group of subcavities. Thus one of the polarization state would be amplified within the VECSEL laser cavity. By switching the electrical bias between the two groups of subcavities, the polarization of the laser can be rapidly switched with no mechanical moving parts. The QC VECSEL with switchable polarization is also called "polarimetric QC VECSEL" in this disclosure.

Embodiment 1

Figure 1:
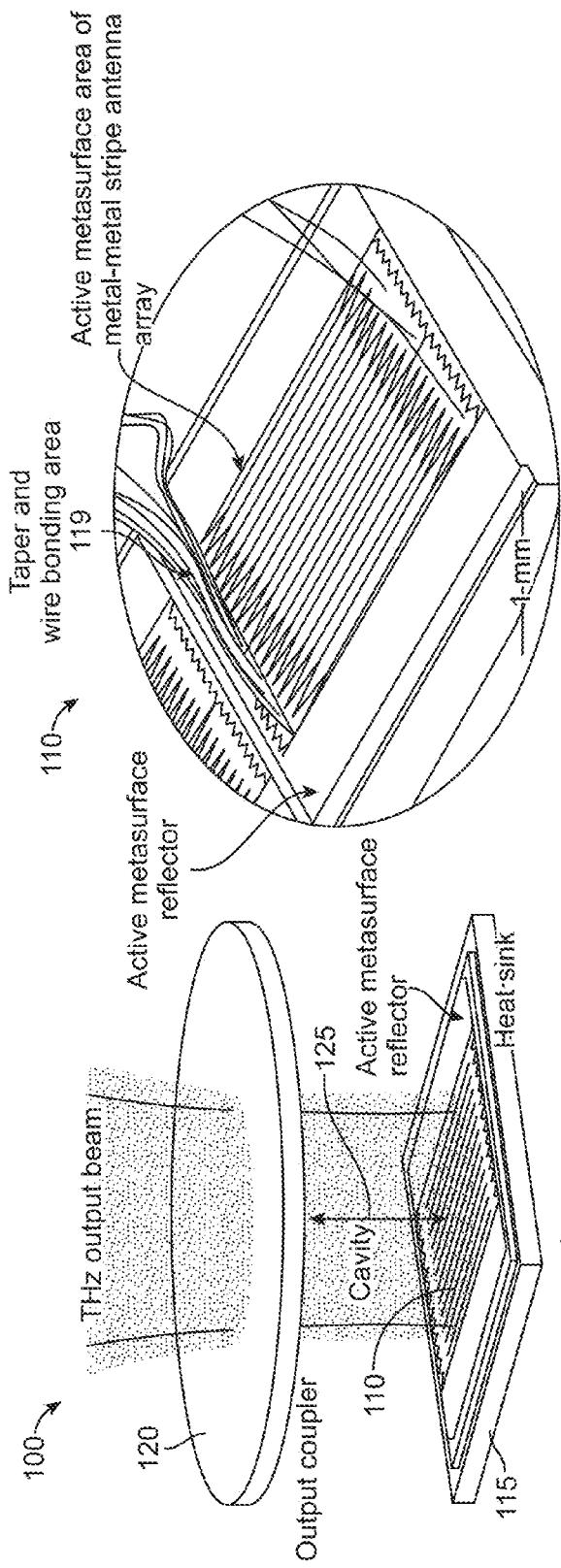
FIG. 1(a) is a schematic diagram of a THz QC VECSEL composed of a metasurface reflector and an output coupler, according to an embodiment.
FIG. 1(b) is an SEM image of a metasurface reflector with a 1.5×1.5 mm active area.
FIG. 1(c) is a schematic diagram of an array of subcavities used in a metasurface reflector and a corresponding resonant-phonon QC laser active region.

Referring to FIG. 1, a schematic diagram of a THz QC VECSEL based on a metasurface reflector is shown according to an embodiment. By way of example, the laser as shown is in the THz range, for example, in the range of about 1-5 THz. Terahertz laser sources are useful for THz imaging and spectroscopy applications, such as, but not limited to, spectroscopy and multi-spectral imaging of materials such as explosives and drugs, non-destructive evaluation imaging of films and coatings for industrial process control or corrosion detection. Other possible applications include biomedical THz imaging, THz communications, and THz imaging for security screening. It shall be understood although the embodiments can have many utilities in the THz frequency range, the laser can be applied in other frequency ranges as well by using appropriate active metasurfaces, for example, in the mid-infrared (IR) and near-IR frequency ranges.

FIG. 1(a) shows a THz QC-VECSEL 100 composed of a metasurface reflector 110 and an external reflector (e.g., output coupler) 120. FIG. 1(b) shows an SEM image of the metasurface reflector 110 with a 1.5×1.5 mm active area. FIG. 1(c) shows an array of subcavities 112 corresponding to the resonant-phonon QC-laser active region represented in the circle 130.

The THz QC VECSEL 100 comprises the metasurface reflector 110 and the output coupler 120 collectively forming a cavity 125 (e.g., external cavity). The metasurface reflector 110 includes an array of subcavities 112 disposed on a substrate 111. The metasurface reflector 110 can be mounted on a heat sink 115. The array of subcavities 112 can be sparse periodic arrays of strips with a width w of about 10-15 µm (e.g., about 12.5 µm), in which a layer of QC laser active material 116 is sandwiched between metal claddings 114 and 118 above and below—similar in form to a microstrip transmission line. The substrate 111 may be a GaAs substrate. The layer of QC-laser active material 116 may be a GaAs/AlGaAs material system or any other suitable material system such as InGaAs/InAlAs. The layer of QC laser active material 116 is about 10 µm thick, and may be of another suitable thickness, for example, about 1 µm to about 20 µm. Each subcavity may be of another suitable width, for example, about 1 µm to about 20 µm. The width of each subcavity 112 roughly determines the resonance frequency of operation. In particular, if the waveguide subcavities are used in the first higher order lateral mode ($TM_{01}$), the resonant cutoff wavelength is approximately determined by $w \approx \lambda_0/2n$, where $\lambda_0$ is the wavelength in free space and n is the index of refraction in the QC laser active material. For example, a 13 µm-wide subcavity approximately operates at 2.9 THz. A 7 µm-wide subcavity approximately operates at 4.5 THz. A 1.3 µm-wide subcavity approximately operates at 30 THz. The metal-metal ridge waveguide is advantageous for THz QC-lasers; its fundamental optical mode is tightly confined to the QC-laser active material, and its small geometry is beneficial for the heat removal for continuous-wave operation. In this orientation, each subcavity 112 strongly radiates in the surface direction, essentially acting as an elongated patch antenna. Thus, the subcavities 120 are also called antenna-coupled subcavities.

The array of subcavities 112 are spaced with a sub-wavelength period Λ to prevent or reduce Bragg-scattering or excitation of surface modes, as shown in FIGS. 1(b) and 1(c). The sub-wavelength period Λ in FIG. 1 is about 90 µm, and may be of another suitable length, for example, about 25 µm to about 90 µm for a 3 THz laser, or about 15 µm to about 55 µm for a 5 THz laser, and so forth. Unlike a resonant metasurface amplifier, or arrays of $2^{nd}$ order DFBs, each subcavity 112 of FIG. 1 is intentionally designed as a low-quality factor resonator and will not measurably self-oscillate in isolation due to its strong radiative loss. This ensures that lasing occurs primarily or solely when the device is placed within a high-Q external cavity, where the master mode of the external cavity is the primary determinant of the beam and spectral properties. This allows use of optical cavity design techniques to ensure lasing occurs in a fundamental Gaussian mode. In principle, the output power can be scaled up by increasing the active area of the metasurface; furthermore, due to the low fill factor of the metasurface (w/Λ of about 15%) with gain medium, for a given current injection, a much larger emitting aperture may be obtained than would be obtained simply by scaling the waveguide size. The embodiment disclosed herein is unlike other external cavity THz QC lasers in which the external cavities are mainly for frequency tuning, such as providing frequency-selective feedback or adjustable mode coupling. In those QC lasers, the QC laser sub-cavities are capable of lasing even without the external cavities and the output beam patterns are not shaped by the external cavities. Furthermore, unlike other implementations of external cavities, no anti-reflective coating is needed of the laser facets.

In some embodiments, each subcavity 112 is tapered at the edges of the metasurface and terminates in an unbiased region 119 of quantum wells; this is deliberately designed as an absorption boundary condition designed to suppress lasing in the non-radiating fundamental waveguide mode.

Figure 2:
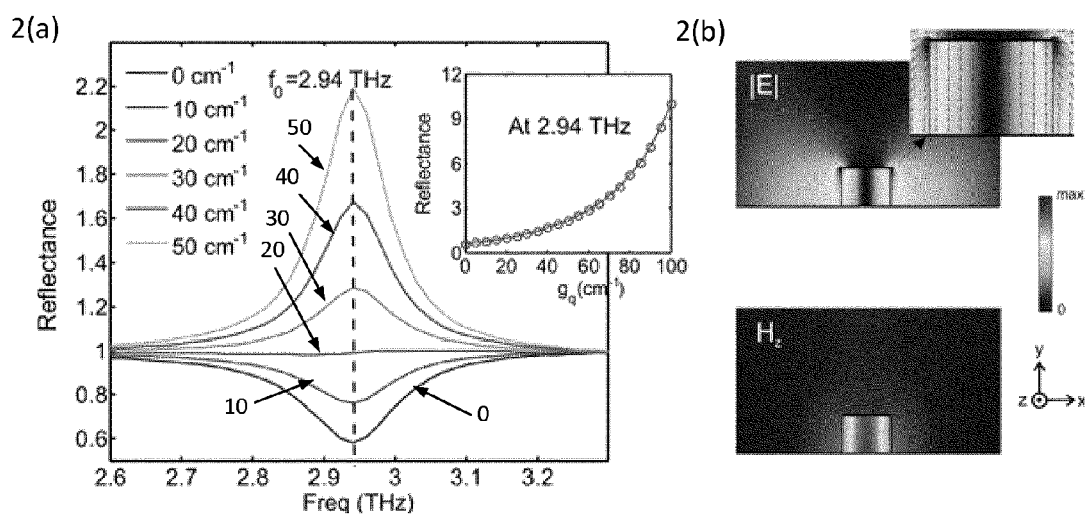
FIG. 2(a) is a graph of simulated reflectance spectra of a metasurface reflector for different medium gains, according to an embodiment.
FIG. 2(b) is a simulated electric and magnetic field distribution in a subcavity of a metasurface reflector under a $TM_{01}$ mode resonant frequency, according to an embodiment.

Referring to FIG. 2, finite-element simulations of the metasurface reflector is shown according to an embodiment. FIG. 2(a) shows a simulated reflectance spectra for different medium gain g ($cm^{-1}$) for an active metasurface with metal-metal waveguide ridge width of about 13 µm and height of about 10 µm, spaced in a period of about 90 µm. The insert shows the reflectance at the resonant frequency of about 2.94 THz increasing with medium gain g. In the calculations, full-wave finite-element electromagnetic models were used to simulate the reflectance spectra for the metasurface including the effects of losses in the metal and QC laser active material. FIG. 2(b) shows the simulated electric and magnetic field distribution in the metal-metal waveguide subcavity operating under the $TM_{01}$ mode at a resonant frequency of about 2.94 THz. The enlarged view shows the electric field magnitude at resonance of 2.94 THz, where the electric field is dominantly polarized in the direction normal to the metal plane, namely, along the growth direction of the quantum wells.

The reflection spectrum shows a characteristic resonant response which changes from net loss to net gain as the QC material gain (g) is increased to simulate the effect of current injection. The QC material gain g is assumed uniform over the spectrum range considered. The resonance is peaked at about 2.94 THz, the cutoff frequency of TM01 mode, for a metasurface with period Λ=about 90 µm, ridge width w=about 13 µm and height h=about 10 µm. The unity (1) reflection is reached when g=about 20 cm-1. With the gain above this value, the reflectance surpasses unity, which means the metasurface reflector can amplify the incident radiation to provide the gain to the VECSEL cavity. For g=about 30 cm-1, the metasurface reflector has a reflectance of more than about 1.2 at the resonant frequency, which is sufficient to compensate for round-trip power external cavity loss that can be minimized to <about 10% for this setup (see the "Simulation and Modeling" section).

In this implementation, the gain medium used for the active metasurface reflector is a resonant-phonon quantum cascade material with the gain from about 2.7 to about 3.7 THz, with the peak of about 2.9 THz. Various metasurfaces were fabricated with ridge widths varying from about 11.5 µm to about 13.5 µm to overlap with the gain peak. While several metasurfaces were made to laser, a design with width w=about 12.5 µm showed the best performance—presumably due to the best overlap of the gain spectrum with the metasurface resonance. In the fabricated metasurface shown in FIG. 1(b), the active area is 1.5×1.5 mm, which includes seventeen (17) about 1.5 mm-long and about 10 µm-high strips spaced with a period of about 90 µm. The periodicity Λ=90 µm was chosen to be slightly less than the free-space wavelength $\lambda_0$ to prevent Bragg scattering induced diffraction loss for normally incident waves. It shall be understood that the metasurface may include other numbers of suitable of ridges of other suitable dimensions.

The metal-metal waveguides are electrically biased through the top metallization (e.g., using an electrical power source)—making this an electrically pumped VECSEL. Other embodiments can be pumped in another manner, such as optically pumped using an optical source. The taper and wire bonding area (e.g., area 119 of FIG. 1) is kept electrically unbiased by depositing a dielectric layer underneath the top metallization. This ensures non-active areas would not consume electrical power, provides an absorbing boundary condition at the edges, and together with the unbiased reflectors on the two sides of the active area, provides a highly reflecting surface for surface incident radiation (e.g., the wings of the cavity mode).

Figure 3:
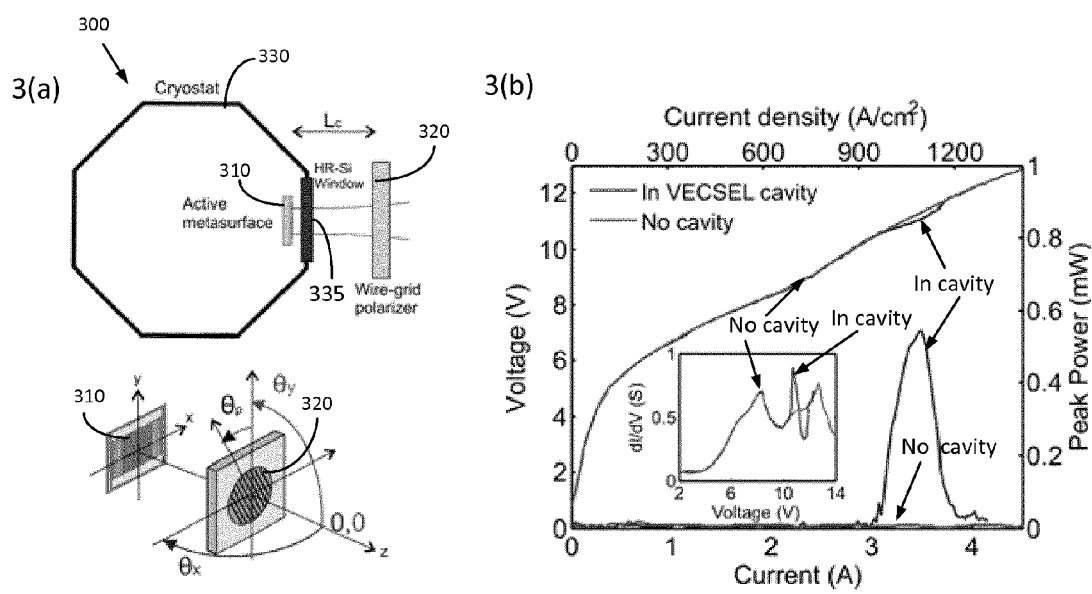
FIG. 3(a) is a schematic diagram of an experimental setup for a THz QC VECSEL in a plano-plano FP Cavity, according to an embodiment.
FIG. 3(b) is a graph of voltage vs. light current and peak power vs. current density for a metasurface reflector in the case of being placed in a VECSEL cavity and in the case of not being placed in the cavity, according to an embodiment.

Referring to FIG. 3, setup and characteristics of a THz QC VECSEL are shown according to an embodiment. FIG. 3(*a*) shows the experimental setup for the THz QC VECSEL 300 in a plano-piano FP Cavity. In the QC VECSEL 300, a metasurface reflector 310 is mounted on a heat sink (not shown in the present figure) inside a cryostat 330. An output coupler 320 is mounted outside and forms the external cavity with the metasurface reflector 310. The cavity length $L_c$ (e.g., the distance between the metasurface reflector 310 and the output coupler 320) is about 6 mm. The output coupler 320 is a free-standing wire-grid THz polarizer, where the wire orientation angle $\theta_p$ on the wire-grid polarizer dominantly decides the output coupling efficiency for the VECSEL 300. Since the metasurface primarily or solely amplifies incident radiation with the electric field polarized transverse to the strips, the minimum output coupling loss may be achieved with the polarizer's wire orientation parallel to the electric polarization, which is transverse to the strips, as shown in FIG. 3(*a*) with $\theta_p=0°$. Other types of reflector/mirror can be used as the output coupler, such as but not limited to, partially transmitting mirror, mirrors with a central hole to couple out the beam, metallized mesh couplers (either inductive or capacitive), gratings that provide frequency selective reflection, or other transmitting metasurfaces that provide frequency and/or polarization selective reflection. The cryostat 330 has a window 335 constructed of about 3 mm thick high-resistivity silicon (HR-Si), which also may act as an etalon. It shall be understood that the cryostat window may be made of any suitable material with any suitable dimension and that the cavity length can be of any suitable value.

FIG. 3(*b*) shows the voltage vs. light-current curve and power vs. current density curve for the metasurface reflector in the case of being placed in the external cavity and in the case of not being placed in the cavity (i.e., the output coupler is removed) at 77 K. The insert is the differential conductance (dI/dV) vs. voltage curves for the two cases. The curves for the "in cavity" case were measured in pulsed mode at 77 K. The curves for the "no cavity" case were measured with the output coupler being removed to destroy the external cavity mode and indeed no lasing signal was detected. This confirms the VECSEL lasing. Lasing threshold is accompanied by a pronounced increase in the differential conductance due to decrease in the upper state lifetime with the onset of stimulated emission. At 77 K, the emission spectrum is single-mode (within the resolution limits of the spectrometer used of about 7 GHz) at about 2.846 THz, and is unchanged with electrical bias, or adjustments in cavity length. It is believed that this results from the etalon effect of the HR-Si window, in combination with the limited resonant frequency range of the metasurface reflector.

Figure 4:
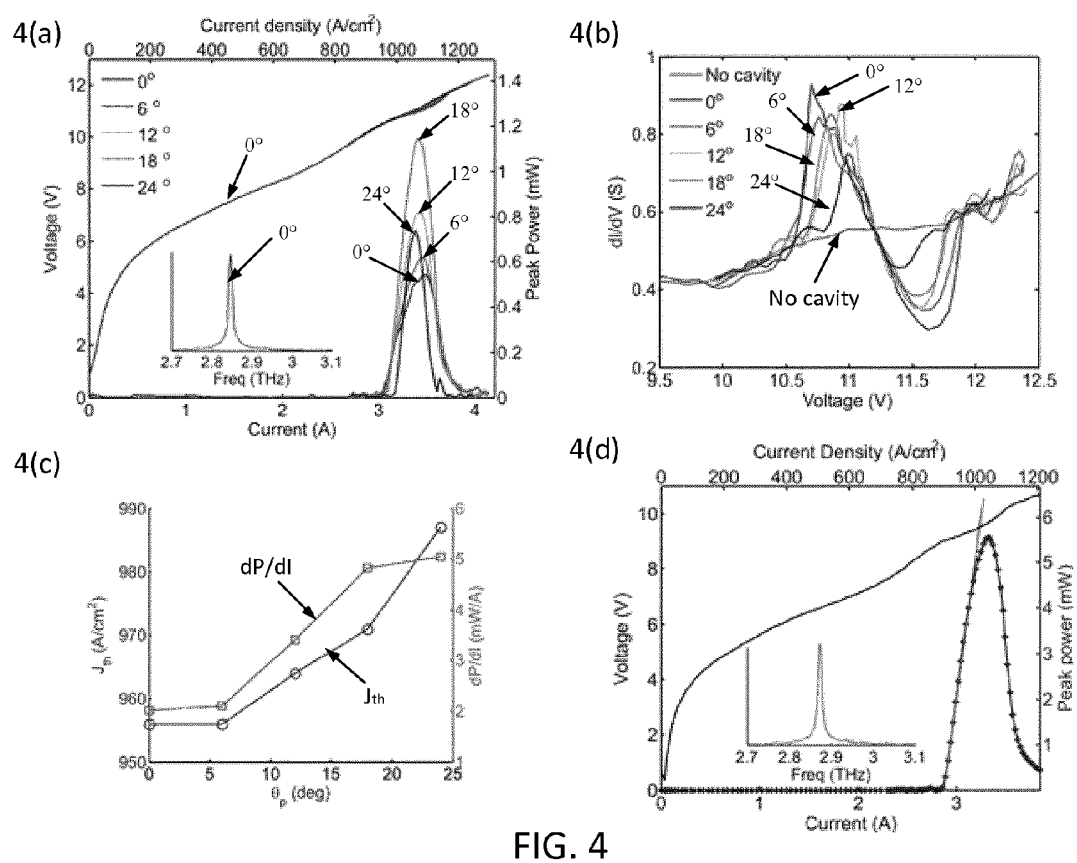
FIG. 4(a) is a graph of voltage vs. light current and peak power vs. current density for a THz QC VECSEL for a set of different polarization angles of an output coupler, according to an embodiment.
FIG. 4(b) is a graph of differential conductance vs. voltage for a THz QC VECSEL for a set of different polarization angles of an output coupler and in the case of no cavity, according to an embodiment.
FIG. 4(c) is a graph of threshold current density and slope efficiency across a range of polarization angles of an output coupler from 0° to 25°, according to an embodiment.
FIG. 4(d) is a graph of voltage vs. light current and peak power vs. current density for a THz QC VECSEL for an output coupler polarization angle of about 30°, according to an embodiment.

Referring to FIG. 4, characteristics of the THz QC VECSEL are shown for different polarization angles $\theta_p$ of the output coupler, according to an embodiment. As noted above, the wire orientation angle $\theta_p$ on the wire-grid polarizer (e.g., used as the output coupler) dominantly decides the output coupling efficiency for the VECSEL. The polarized response of both the metasurface reflector and output coupler polarizer allows one to increase the output coupling transmittance by varying the angle $\theta_p$ of the polarizer. As for a laser, there is an "optimum coupling" value, such as for low output coupling loss, where the threshold is lower and circulating power is higher, but less power is coupled out (and vice versa). Thus the output power and slope efficiency can be optimized for a particular metasurface and operating temperature, albeit in a non-trivial fashion, since the output power depends on the polarization state of the circulating lasing mode, which in turn depends on the co- and cross-polarized reflection coefficients of both the polarizer and metasurface reflector.

FIG. 4(*a*) shows voltage vs. current curve and peak power vs. current density curve for a set of polarizer angles from 0° to 24° at 77 K. As shown, an output peak power of about 1.15 mW was achieved with $\theta_p$=about 18°.

FIG. 4(*b*) shows differential conductance (dI/dV) vs. voltage curves for a set of polarizer angles from 0° to 24° at 77 K. The peaks on the curves, resulting from the VECSEL lasing, become lower as the angle increases, which indicates a lower circulating intensity within the cavity and aligns with the trend that the output coupling loss is higher for a larger angle. For $\theta_p$>about 24°, the output coupling loss becomes too high for the VECSEL to reach the lasing threshold.

FIG. 4(*c*) shows the threshold current density ($J_{th}$) vs. orientation angle curve and the slope efficiency (dP/dI) vs. output coupler polarization angle curve. Both the threshold current density and slope efficiency increase with the polarization angle $\theta_p$.

FIG. 4(*d*) shows pulsed mode P-I-V characteristics and spectrum measured at 6 K, with the polarizer angle $\theta_p$=about 30°. The maximum output power was measured to be about 5.5 mW, with the slope efficiency of about 16.7 mW/A. The single-mode lasing frequency was about 2.873 THz with a shift of about 27 GHz from the lasing frequency at 77 K, which represents two longitudinal mode hops in the FP cavity, each of about 14 GHz determined by the HR-Si window's free spectral range as an etalon. This mode hopping is presumably a result of the metasurface's reflection peak and phase change, and the active medium's gain profile change with temperature.

Figure 5:
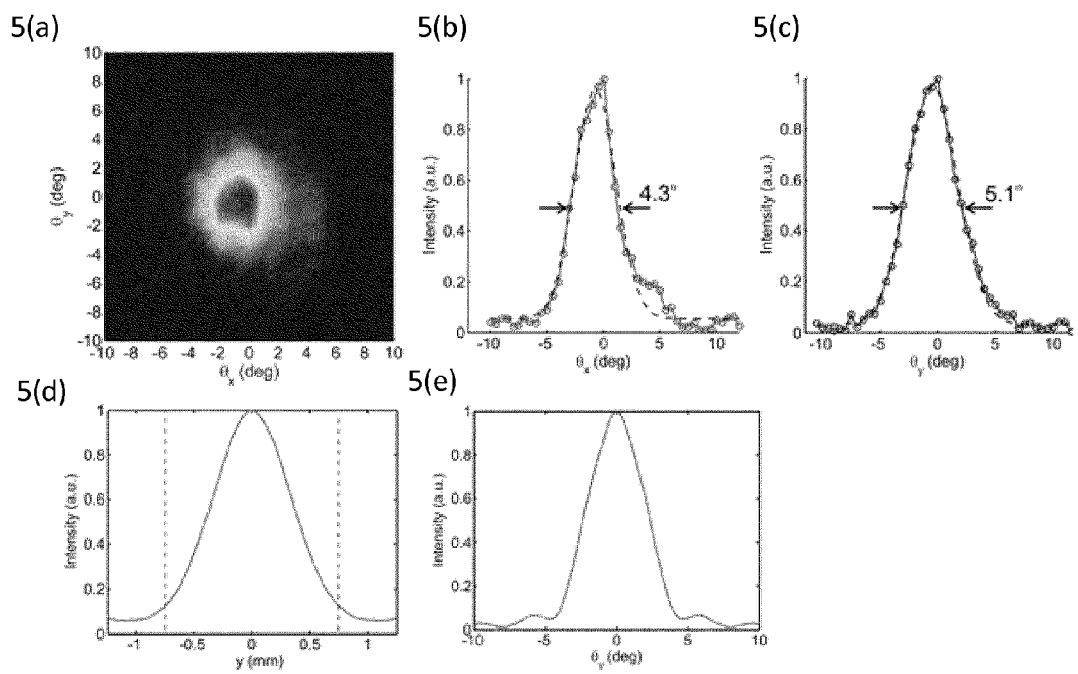
FIG. 5(a) is a picture of a beam pattern measured for a THz QC-VECSEL, according to an embodiment.
FIG. 5(b) is a graph of one-dimensional cut of the beam pattern of FIG. 5(a) through the intensity maximum along $\theta_x$ angular direction with a Gaussian curve fit.
FIG. 5(c) is a graph of one-dimensional cut of the beam pattern through the intensity maximum along $\theta_y$ angular direction with a Gaussian curve fit.
FIG. 5(d) is a graph of calculated one-dimensional mode profile on a metasurface reflector.
FIG. 5(e) is a graph of calculated one-dimensional far field beam pattern.

Referring to FIG. 5, beam patterns of the QC VECSEL is shown according to an embodiment. FIG. 5(*a*) shows the far-field beam pattern measured at 77 K. FIG. 5(*b*) shows the one-dimensional cut of the beam pattern through the center along $\theta_x$ direction with a Gaussian curve fit (the dash-line curve). FIG. 5(*c*) shows the one-dimensional cut of the beam pattern through the center along $\theta_y$ direction with a Gaussian curve fit (the dash-line curve). Beam patterns in FIGS. 5(*b*) and 5(*c*) show good fits with Gaussian curves. The full-wave half-maximum (FWHM) divergence angle is estimated to be about 4.3° in the $\theta_x$ direction and about 5.1° in the $\theta_y$ direction. More generally, the divergence in the $\theta_x$ direction is about 10° or lower, about 8° or lower, about 6° or lower, or about 4° or lower, and the divergence in the $\theta_y$ direction is about 10° or lower, about 8° or lower, about 6° or lower, or about 4° or lower. The beam pattern is quite circular and directive with a directivity D=about 44 dB. The plano-plano FP cavity, though not an ideal Gaussian cavity, can support a quasi-stable cavity mode with a low loss (<about 10%) and near-Gaussian mode profile, which can be modeled by a numerical approach based on Fox-and-Li method. FIG. 5(*d*) shows the calculated one-dimensional mode profile on the metasurface (y=0 defines the center of the metasurface). Dashed lines indicate the boundary between the active area and the passive reflector. FIG. 5(*e*) shows the calculated one-dimensional far-field beam pattern along $\theta_y$ direction.

Embodiment 2

Referring to FIG. 6, a THz QC VECSEL is shown according to another embodiment. FIG. 6(*a*) shows a THz QC-VECSEL 600 based on a metasurface reflector 610. FIG. 6(*b*) shows the reflector 610 with an array of subcavities operating under Gaussian TEM$_{00}$ mode (waist w$_0$). FIG. 6(*c*) shows an individual subcavity 612 fabricated using Cu—Cu thermo-compression bonding. FIG. 6(*d*) shows a resonant phonon QC-laser active region. FIG. 6(*e*) shows an SEM image of the subcavity 612. FIG. 6(*f*) shows simulated electric field vectors in one unit cell of the subcavity 612.

Like the THz QC VECSEL 100 shown in FIG. 1, the THz QC VECSEL 600 comprises the metasurface reflector 610 and an output coupler 620. The metasurface reflector 610 may be mounted on a heat sink 615. The metasurface reflector 610 includes an array of subcavities 612 disposed on a substrate 611. The array of subcavities 612 can be sparse periodic arrays of metal-metal waveguide strips, in which a layer of QC-laser active material is sandwiched between metal claddings above and below. The substrate 611 may be a GaAs substrate. The layer of QC laser active material may be a GaAs/AlGaAs material system or any other suitable material system such as InGaAs/InAlAs. The resonant cutoff wavelength of the subcavities 612 is approximately determined by w≈$\lambda_0$/2n, where $\lambda_0$ is the free-space wavelength and n is the index of refraction in the QC laser active material. The array of subcavities 612 are spaced with a sub-wavelength period Λ to prevent or reduce Bragg-scattering or excitation of surface modes. The metasurface reflector 610 forms an external laser cavity with the output coupler 620 such that multiple THz QC-laser subcavities are locked to a high-Q cavity mode, allowing for scalable power combining. The VECSEL 600 of FIG. 6 is also electrically pumped, where injection current distribution is assisted by the top metallization of the planar antennas. Different from the THz QC VECSEL 100 shown in FIG. 1, in this embodiment, physical holes 613 were made in at least some of the subcavities 612, as shown in FIGS. 6(*c*) and 6(*e*). The physical holes 613 may help improve the efficiency of the QC laser.

Embodiment 3

Figure 7:
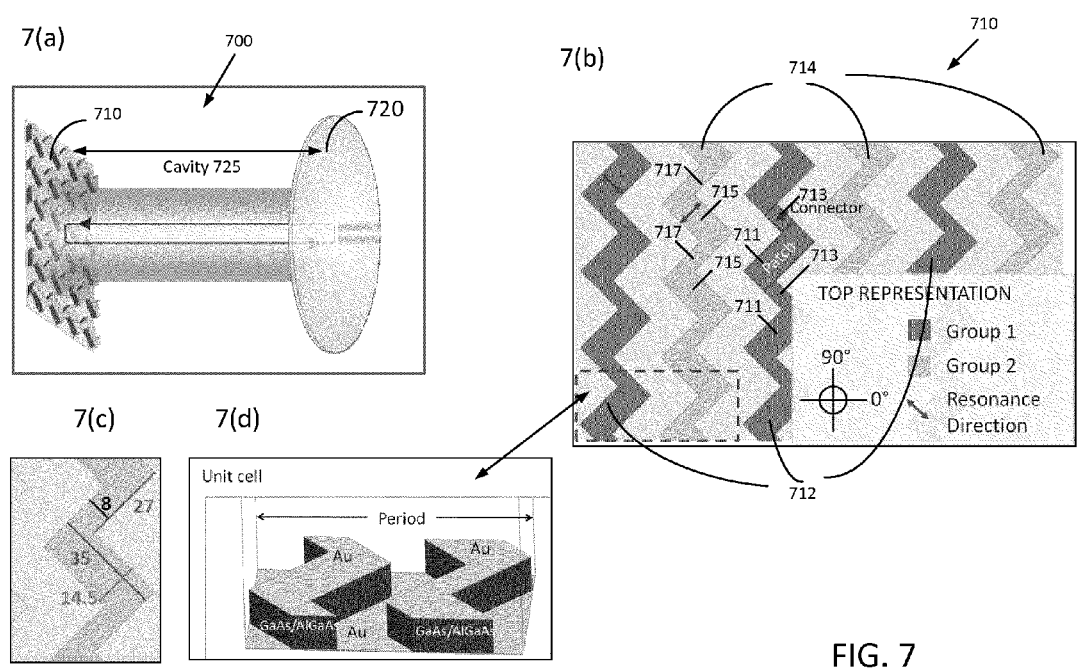
FIG. 7(a) is a schematic diagram of a polarimetric THz QC VECSEL composed of a metasurface reflector and an output coupler, according to an embodiment.
FIG. 7(b) is a schematic diagram of a metasurface reflector that has two groups of subcavities responsive to light of different polarization states, according to an embodiment.
FIG. 7(c) is a schematic diagram of dimensions of a subcavity, according to an embodiment.
FIG. 7(d) is an enlarged three-dimensional view of a unit cell of the metasurface reflector, which corresponds to the area enclosed by dashed lines in FIG. 7(b).

Referring to FIG. 7, a polarimetric THz QC VECSEL is shown according to an embodiment. As discussed above, an external cavity THz laser using a sub-wavelength array of QC laser metal-metal waveguide strips as an amplifying mirror metasurface reflector has excellent output beam quality. An attractive property of such a reflective array metasurface VECSEL is the potential for shaping the subcavities to control the polarization response. A polarimetric QC VECSEL refers to the QC VECSEL with switchable (e.g., controllable) polarization response. FIG. 7(*a*) shows a polarimetric THz QC VECSEL 700 comprising a metasurface reflector 710 and an output coupler 720 collectively forming a cavity (e.g., external cavity) 725. FIG. 7(*b*) shows the metasurface reflector 710 comprising a first group of subcavities 712 and a second group of subcavities 714 interlaced with each other. FIG. 7(*c*) shows dimensions of a subcavity in μm. FIG. 7(*d*) shows an enlarged three-dimensional view of a unit cell of the metasurface reflector 710, which corresponds to the area enclosed by dashed lines in FIG. 7(*b*).

Like the THz QC VECSEL 100 shown in FIG. 1, the polarimetric THz QC VECSEL 700 comprises the metasurface reflector 710 and output coupler 720 collectively forming the cavity. The metasurface reflector 710 may be mounted on a heat sink (not shown in the present figure). The metasurface reflector 710 includes an array of subcavities disposed on a substrate (e.g., a GaAs substrate). Each of the subcavities includes a layer of QC-laser active material (e.g., GaAs/AlGaAs or InGaAs/InAlAs) sandwiched between metal claddings (e.g., Au) above and below. In the example shown in FIG. 7, the clapping metal layer is a layer of Au with a thickness of about 0.2 μm; the layer of active QC-laser material is about 10 μm.

Different than the THz QC VECSEL 100 of FIG. 1, the subcavities of the polarimetric QC VECSEL 700 include a first group of subcavities 712 and a second group of subcavities 714 interlaced with each other. Each subcavity 712 in the first group includes a plurality of parallel patches 711 electrically connected by a plurality of connectors 713. The resonant cutoff wavelength of the first-group subcavities 712 is approximately determined by the width w of the patches 711, i.e., w≈$\lambda_0$/2n, where $\lambda_0$ is the free-space wavelength and n is the index of refraction in the QC laser active material. In some embodiments, the width of the connectors 713 is less than the width of the patches 711. Each subcavity 714 in the second group includes a plurality of parallel patches 715 electrically connected by a plurality of connectors 717. The resonant cutoff wavelength of the second-group subcavities 714 is approximately determined by the width of the patches 715. In some embodiments, the width of the connectors 717 is less than the width of the patches 715. As shown in FIG. 7(*d*), each unit cell of the active metasurface includes a patch from the first group and a patch from the second group. In the example, the period Λ is about 70 μm.

The orientation of the patches 711 of the first group is different than the orientation of the patches 712 of the second group. In the example shown in FIG. 7, the orientation of the first patches 711 forms an about 45° angle with the horizontal axis, while the orientation of the second patches 715 forms an about 135° angle with the horizontal axis. Due to the different orientations, the first patches 711 and the second patches 715 selectively reflect incident waves of different polarization states with amplification. In particular, the first patches 711 amplify 135° polarized light, while the second patches 715 amplify 45° polarized light. Thus, the two groups of subcavities can be biased separately to selectively apply gain to incident waves of different polarization states.

The polarimetric metasurface reflector 710 has a complex reflection matrix:

$$\Gamma_M = \begin{bmatrix} \Gamma_{xx} & \Gamma_{xy} \\ \Gamma_{yx} & \Gamma_{yy} \end{bmatrix},$$

where x and y are directed in the 45° and 135° polarization angles. The round-trip propagation matrix for the polarimetric QC VECSEL 700 is $\Gamma_C = L\Gamma_M$, where L is a scalar representing the round-trip loss of the cavity 725. The eigenvectors of $\Gamma_C$ give the eigenmodes of the cavity 725. For L=0.9, g=30 cm$^{-1}$, f=3.28 THz, $\Gamma_C$ has the eigenvector:

$$\begin{bmatrix} 0.08 - 0.16j \\ 0.98 + 0.00j \end{bmatrix},$$

which indicates an elliptical polarization with a polarization purity of 41.

Figure 8:
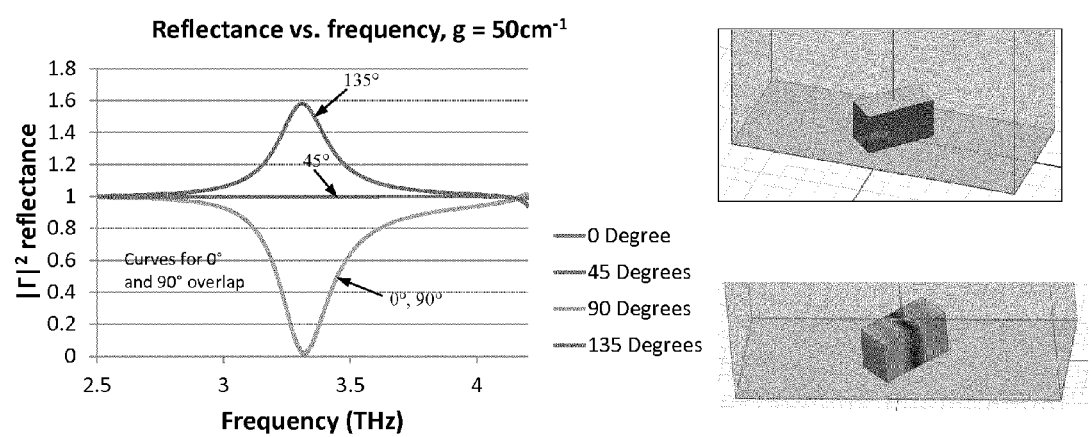
FIG. 8 is a graph of reflectance spectrum for an individual patch of a subcavity in the first group at a medium gain of g=50 cm$^{-1}$, according to an embodiment.

Simulation results affirm the feasibility of the polarimetric metasurface laser based on specifically shaped subcavities whose reflectance is polarization-selective. Referring to FIG. 8, a reflectance vs. frequency curve is shown for an individual patch 711 of the first group at a gain g=50 cm$^{-1}$.

Figure 9:
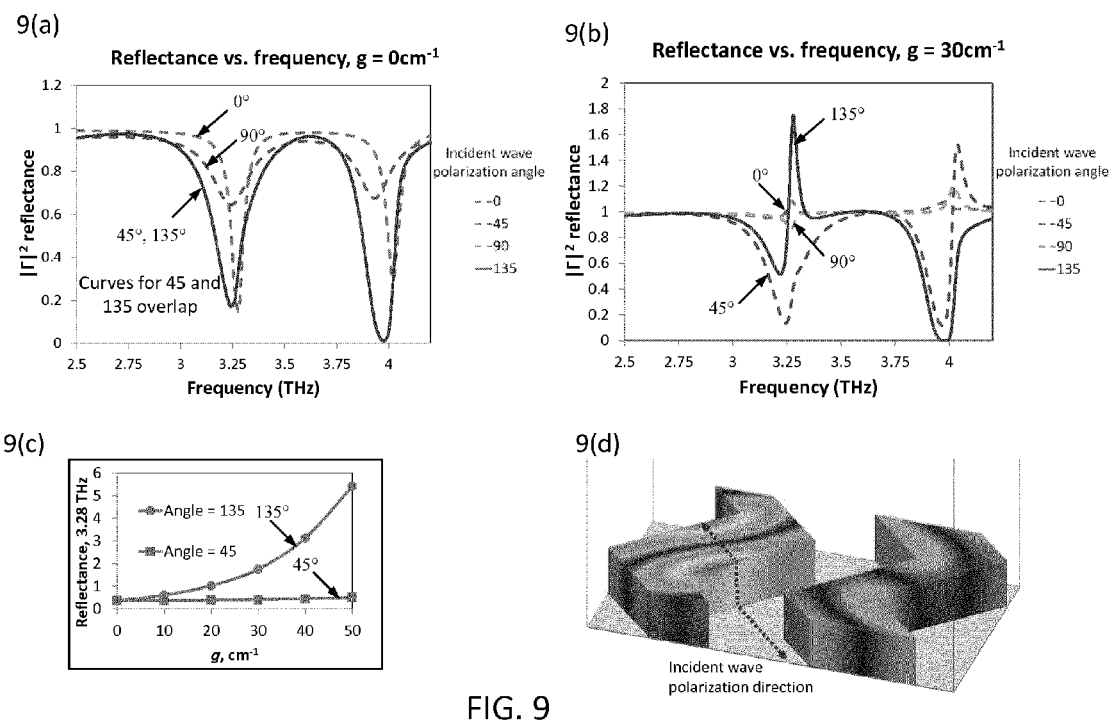
FIG. 9(a) is a graph of reflectance spectra at a medium gain of g=0 cm$^{-1}$ for the metasurface reflector of FIG. 7 for a set of different polarization angles of incident waves, according to an embodiment.
FIG. 9(b) is a graph of reflectance spectra at a medium gain of g=30 cm$^{-1}$ for the metasurface reflector of FIG. 7 for a set of different polarization angles of incident waves, according to an embodiment.
FIG. 9(c) is a graph of reflectance at resonant frequency vs. medium gain for the metasurface reflector of FIG. 7 for incident wave polarization angles of 45° and 135°, according to an embodiment.
FIG. 9(d) is a picture of the electric field distribution in a patch of the first group and a patch of the second group, when a 3.28 THz wave polarized at 135° is incident on the metasurface and a gain of g=40 cm$^{-1}$ is applied to the first group of subcavities, according to an embodiment.

Referring to FIG. 9, simulated characteristics of the polarimetric metasurface reflector 710 are shown. In the simulation, the second group of cavities 714 receive no gain (e.g., no injection current is applied), while the first group of cavities 712 receive variable gains between 0 cm$^{-1}$ to 50 cm$^{-1}$. Periodic boundary conditions were used with High Frequency Structure Simulator (HFSS) to simulate the subcavity array. Materials are described using the Drude model. The material definition for the QC laser active material is anisotropic. FIG. 9(a) shows a simulated reflectance spectra for medium gain g=0 cm$^{-1}$ for incident wave of different polarization angles (e.g., 0°, 45°, 90°, and 135°) between 2 THz and 5 THz. FIG. 9(b) shows a simulated reflectance spectra for medium gain g=30 cm$^{-1}$ for incident wave of different polarization angles (e.g., 0°, 45°, 90°, and 135°) between 2 THz and 5 THz. At the target frequency of 3.3 THz, primarily or solely light polarized at 135° receives significant gain. Asymmetry characteristic of Fano resonance is also seen for the reflectance profile of 135° polarization at g=30 cm$^{-1}$. FIG. 9(c) shows reflectance at the resonant frequency of about 3.28 THz vs. medium gain for incident wave polarization angles of 45° and 135°. Primarily or solely linear 135° polarized light increases with the gain, the reason being electrical injection was applied to the first group of subcavities but not the second group of subcavities. The orthogonal linear polarization at 45° light was absorbed by the metasurface. FIG. 9(d) shows the electric field distribution in a patch of the first group (on the left) and a patch of the second group (on the right) when the 3.28 THz wave polarized at 135° is incident on the metasurface and a gain of g=40 cm$^{-1}$ is applied to the first group of subcavities. The top layer of Au is not shown in FIG. 9(d). Electric field pattern in the patch of the first group shows strong resonance across the patch in the direction of polarization while electric field activity in the patch of the second group is much lower, which confirms that the patches resonate as intended.

Figure 10:
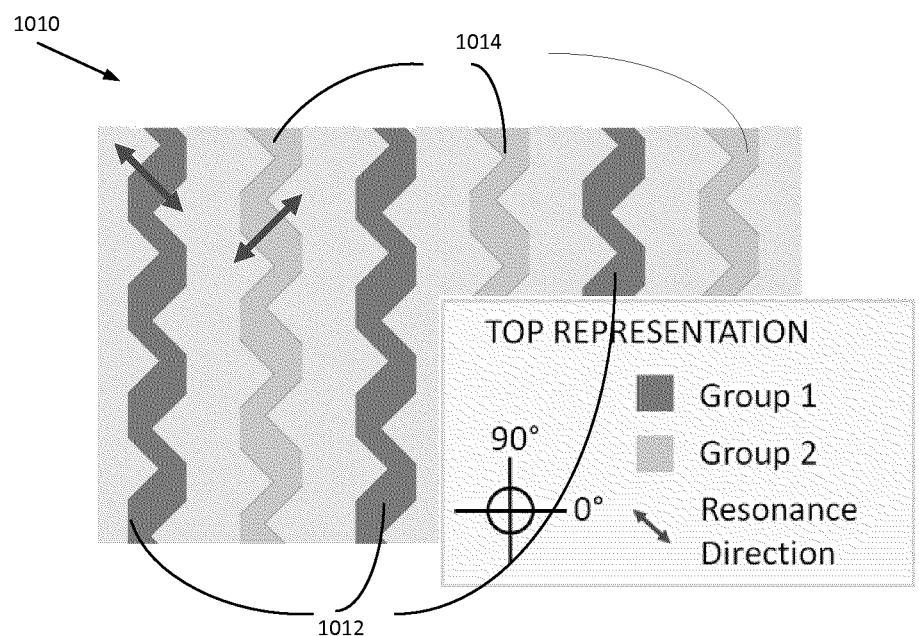
FIG. 10 is a schematic diagram of a metasurface reflector which is a modification of the metasurface reflector shown in FIG. 7.

Referring to FIG. 10, a modified embodiment to the polarimetric metasurface reflector 710 of FIG. 7 is shown. Like FIG. 7, a polarimetric metasurface reflector 1010 includes a first group of subcavities 1012 and a second group of subcavities 1014 interlaced with each other. The first group and second group of subcavities amplify incident wave of different polarization states. Different from the metasurface reflector 710, the sharp bends of the subcavities are clipped off in order to reduce scattering and cross-polarization.

Referring to FIG. 11, simulated characteristics of the polarimetric metasurface reflector 1010 are shown. In the simulation, the second group of cavities 1014 receive no gain (e.g., no injection current is applied), while the first group of cavities 1012 receive variable gains between 0 cm$^{-1}$ to 50 cm$^{-1}$. FIG. 11(a) shows a simulated reflectance spectra for medium gain g=0 cm$^{-1}$ for incident wave of different polarization angles (e.g., 0°, 45°, 90°, and 135°) between 2 THz and 5 THz. FIG. 11(b) shows a simulated reflectance spectra for medium gain g=30 cm$^{-1}$ for incident wave of different polarization angles (e.g., 0°, 45°, 90°, and 135°) between 2 THz and 5 THz. FIG. 11(c) shows reflectance at the resonant frequency of about 3.324 THz vs. medium gain for incident wave polarization angles of 45° and 135°. Primarily or solely linear 135° polarized light increases with the gain, the reason being electrical injection was applied to the first group of subcavities but not the second group of subcavities. The orthogonal linear polarization at 45° light was absorbed by the metasurface. FIG. 11(d) shows the electric field distribution in a patch of the first group (on the left) and a patch of the second group (on the right) when the 3.324 THz wave polarized at 135° is incident on the metasurface and a gain of g=40 cm$^{-1}$ is applied to the first group of subcavities. Electric field pattern in the patch of the first group shows strong resonance across the patch in the direction of polarization while electric field activity in the patch of the second group is much lower, which confirms that the patches resonate as intended.

Figure 12:
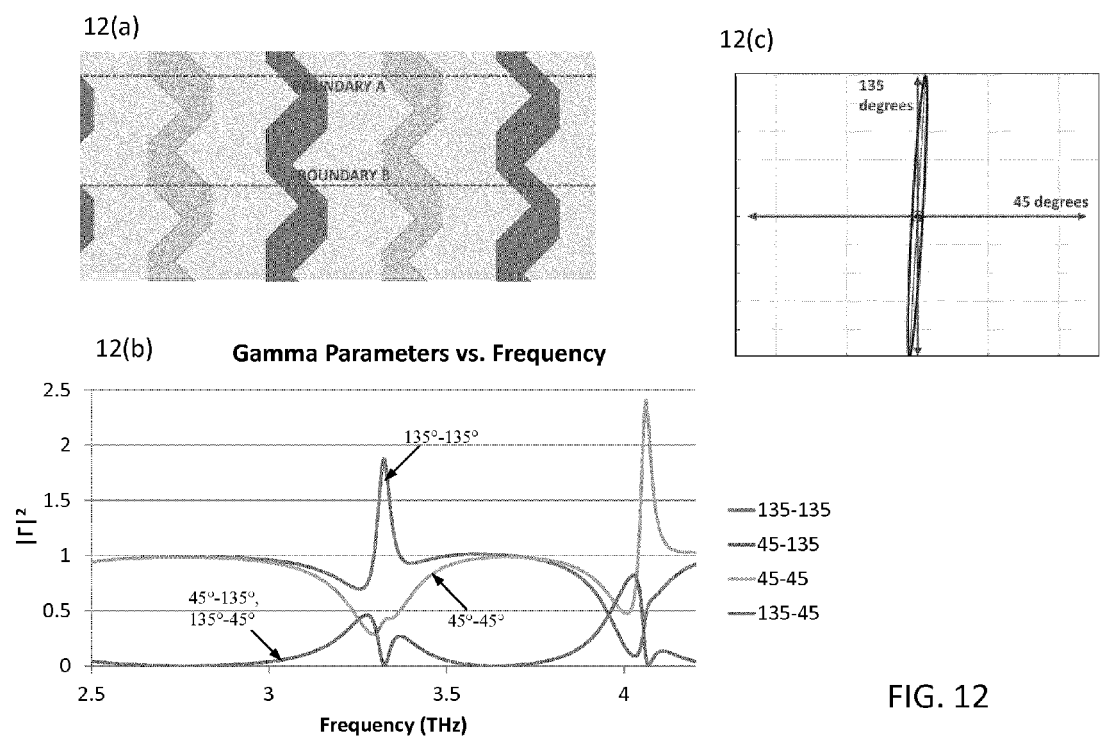
FIG. 12(a) is a schematic diagraph showing the periodic boundaries used to simulate the metasurface reflector of FIG. 10.
FIG. 12(b) is a graph showing reflectance spectra for each parameter of the Gamma matrix, according to an embodiment.
FIG. 12(c) is a graph showing an external reflector that is not polarization selective, according to an embodiment.

Eigenmodes are simulated for the metasurface reflector 1010. Referring to FIG. 12, assumptions and parameters used to calculate the eigenmodes for the metasurface reflector 1010 are shown. FIG. 12(a) shows the periodic boundaries used to simulate the metasurface reflector 1010. The cavity eigenmodes are calculated by finding the eigenvector of the complex Gamma matrix:

$$\Gamma_M = \begin{bmatrix} \Gamma_{45-45} & \Gamma_{45-135} \\ \Gamma_{135-45} & \Gamma_{135-135} \end{bmatrix}.$$

FIG. 12(b) shows reflectance spectra for each of the parameters of the Gamma matrix. The output coupler is assumed to be not polarization selective, as shown in FIG. 12(c). The tile is 3.25°, the axial ratio is 26.8, and the polarization is left elliptical. The medium gain is 70 cm$^{-1}$. Accordingly, the self-lasing mode occurs at 3.058 THz, which is reasonably far from the target frequency of 3.3 THz.

The example embodiments of polarimetric metasurface reflectors shown in the above FIGS. 7-12 are some possible implementations for selectively amplifying linear polarized light. It shall be understood that polarimetric metasurface reflectors can be designed to selectively amplify and switch between other polarization states, such as right-hand or left-hand circularly polarized light.

It shall also be understood that while the example embodiments in this disclosure use metallic subcavity antenna for illustration, other dielectric implementations are possible to reduce the losses at shorter wavelengths associated with metals.

The polarimetric metasurface reflectors 710 and 1010 may be used as an amplifying mirror to realize an electrically-controlled, polarization-switchable THz QC laser. The subcavities are set up such that electrical current injection can be applied to either one group of subcavities, therefore the polarization of the laser can be rapidly switched without mechanical moving parts. Accordingly, the polarimetric metasurface reflectors 710 and 1010 can be useful in many applications. As discussed above, THz laser sources are useful for THz imaging and spectroscopy applications. THz imaging applications include spectroscopy and multi-spectral imaging of materials such as explosives and drugs, non-destructive evaluation imaging of films and coatings, for industrial process control or corrosion detection. The ability to modulate the polarization of incident light (either for imaging or spectroscopy) allows one to use polarization as an additional contrast mechanism. This is particularly useful for techniques of non-destructive evaluation.

Polarization tends to provide information that is largely uncorrelated with spectral and intensity images, particularly information about material birefringence, surface features, shape, roughness, and edge detail. Differential measurements of circular polarization (e.g., circular dichroism) is a measurement of chirality and helicity and can be used for sensing of biomolecules, characterization of metamaterials, and spin-polarized condensed matter. Polarization can be particularly useful for resolving objects that are obscured by scattering media (such as mist, fog, smoke, turbid water, defect filled material, and so forth), for the reason that multiple scattering events tend to randomize the polarization of the reflected light. Polarization contrast may lead to a major improvement in the ability of THz imaging to perform non-destructive evaluation (NDE), where the features of interest are often buried under a particularly depolarizing medium. Hidden corrosion detection and monitoring are a potential area of major impact of THz NDE because of the sensitivity of polarization to surface roughness associated with corrosion.

Figure 13:
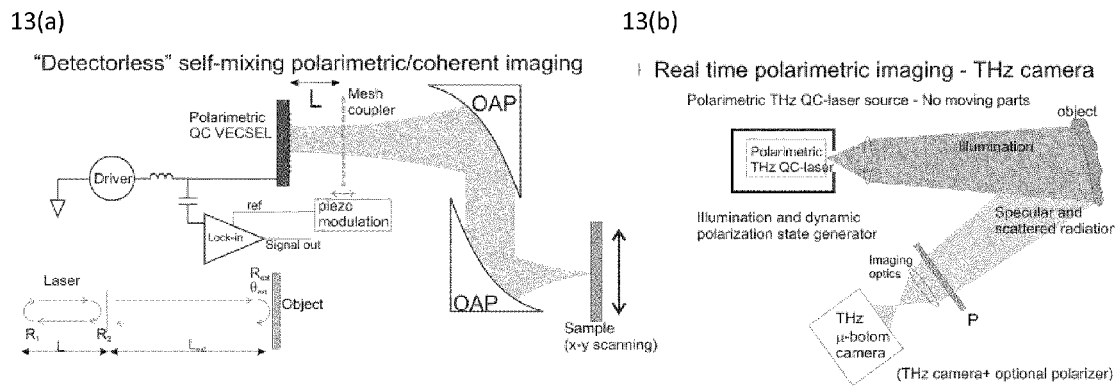
FIG. 13(a) is a schematic diagram of a "detectorless" imaging device using a polarimetric QC VECSEL, according to an embodiment.
FIG. 13(b) is a schematic diagram of a real time THz imaging device using a polarimetric THz QC VECSEL of switchable polarization, according to an embodiment.

By creating THz laser sources with built in capability to switch between linear and/or circular polarization states, rapid, real-time polarization imaging can be accomplished without mechanical moving parts. Referring to FIG. 13, two example applications of the polarimetric metasurface reflectors 710 and 1010 are shown. FIG. 13(a) shows a "detectorless" imaging device where reflected field from an imaging target is coupled back into the laser cavity of the polarimetric QC VECSEL. The reflected field interferes with the cavity field and changes the laser dynamics, which can be read out in the device voltage. This is effectively a homodyne detection technique, where the laser serves as both the source, and the nonlinear mixer. This detection will have the same or similar polarization dependence as the laser source itself. FIG. 13(b) shows a real time THz camera using the polarimetric QC VECSEL.

Advantages

The scheme disclosed herein for the THz QC-VECSEL may have one or more of the following innovative features:

a. Scalability of power with active region area/number of ridges may be achieved. In contrast, on-chip phase locking of laser arrays is difficult to scale to large numbers of cavities without multimode instability, particularly when the coupling is weak between elements. Watt-level output powers may be achieved. The conventional approach to obtain high power THz QC-lasers is to make the waveguide either very thick or very wide (or both). Specifically, high powers of about 1 W have been achieved in pulsed mode at 10 K using large area surface-plasmon waveguide Fabry-Perot cavities. However, while these results were impressive, it is for the pulsed mode (not continuous wave (CW) mode), with typical duty cycles of about 1%. While making the ridge larger can scale up the power in pulsed mode, the thermal dissipation in these designs will impede good CW operation, particularly at more reasonable temperatures that can be achieved through Stirling cycle cryocoolers (e.g., 50K-80K rather than 10K). The surface plasmon (SP) waveguides used are different from the THz QC-VECSEL concept disclosed herein, which is based upon the sub-wavelength size double-metal waveguide. Besides, it is believed that the beam patterns from a SP waveguide would have multiple lobes and fringes.

b. Near-diffraction-limited circular $TEM_{00}$ beams may be sustained by external cavities and spatial filtering to impede higher order mode oscillation. High-quality, directive beams (e.g., divergence angles of about 2-6 degrees) may be achieved from QC-lasers.

c. The antenna metasurface may be strongly coupled to radiation for high optical coupling efficiency ($Q_{rad}$ of about 3-15<<$Q_{met}$ of about 100), unlike most metal-metal QC-lasers waveguides where $Q_{rad}$>>$Q_{met}$, such that most THz radiation may be reabsorbed by the cavity before it is radiated out.

d. Sparse areal coverage of an active material in the metasurface may reduce the areal power dissipation density over large active areas for high power and good continuous wave (CW) performance. For example, areal coverage of an active material over a substrate may be about 90% or less, about 80% or less, or about 70% or less.

e. External cavity laser tuning schemes may be implemented. In contrast, conventional THz QC-laser cavities exhibit highly reflective facets from edge emitters.

f. The antenna coupled metasurface can be engineered to provide spatially dependent gain, phase, or polarization response. This can provide more efficient modal/gain coupling, reflectarray focusing for compact cavities, or beams with customized polarization. This feature is not only applicable to QC lasers, but also may have wide application across the laser field. For example, the metasurface can be designed for different functions, such as output beam with customized beam (e.g., circularly polarized beams, Vortex Beams, Bessel beams, or Cylindrical vector beams) or built-in focusing.

g. The external cavity determines the cavity mode and beam shape, which interacts with various subcavity elements. As a result, even as the polarization is switched, high quality beam profile can remain unchanged.

h. The metasurface can be designed to selectively amplify and switch between incident waves of different polarization states, such as linear polarized light, right-hand or left-hand circularly polarized light.

Simulation and Modeling

The modeling of the active metasurface was undertaken by performing full-wave finite-element simulations using the commercially available Comsol Multiphysics 4.4. Two-dimensional simulations were performed for an unit cell of the metasurface containing a single metal-metal waveguide sub-cavity considered infinitely long. A TM plane wave was excited at the input port and normally incident on the metasurface. The reflectance and phase shift were extracted from the $S_{11}$ parameter for different active region medium gain g over a range of frequencies around the $TM_{01}$ cutoff frequency. The free carrier scattering loss in the top and bottom metallization and the active region was described by the Drude model.

The diffraction loss and cavity mode of the VECSEL cavity were calculated by an one-dimensional numerical model based on the Fox-and-Li method: an uniform electric field was launched at the metasurface and a number of forward and backward propagations were performed by Huygen's integral; the reflectivity distribution on the finite-size metasurface and polarizer was multiplied to the field profile each time the wave gets reflected; the mode profile and round-trip cavity loss converged to a stable state after multiple round trips. For the mode profile and far-field beam pattern calculation, an uniform distribution of unity reflectance was assumed for the active metasurface with a reflected phase shift difference of 170° between the passive reflector area and active area obtained from the finite-element simulation. This phase shift can change the cavity mode to a large extent and its value varies significantly with frequency and ridge width.

Microfabrication and Device Measurement

The quantum cascade structure used for some embodiments of the active metasurface is based on GaAs/AlGaAs material system and was grown by molecular beam epitaxy (MBE). The design is based on four-well resonant phonon depopulation mechanism. The active QC laser system includes 178 modules with the total thickness of about 10 μm. It shall be understood that the active QC laser system may include any suitable modules of any suitable materials to achieve any suitable thickness. The fabrication of the active metasurface followed the steps for making metal-metal waveguides, with an extra step of depositing and patterning the dielectric insulation layer that isolates the metal contacts. In particular, the QC laser wafer was bonded to a n$^+$-doped GaAs wafer via Cu—Cu thermo-compression. Following the wafer bonding, the GaAs substrate on the QC-laser wafer was removed by a combination of mechanical lapping and chemical etching. Then 200 nm $SiO_2$ was deposited on top and patterned by dry etching to isolate the taper and wire bonding area from top metal. Then top metal of Cr/Au/Ni was evaporated and patterned by the metal lift-off technique. The metal-metal waveguide ridges were defined by the Chlorine-based dry etching. The fabrication was finished by evaporating gold on the backside of the wafer.

The wafer was cleaved into small chips each containing one or two metasurface devices. Each chip was indium-soldered on a copper chip carrier, and the device on it was wire bonded. The chip carrier was mounted on the cold stage of the cryostat (Infra-Red Laboratories emission dewar). The P-I-V characteristics were measured in pulsed mode (0.5% duty cycle, 500 ns-long pulse, in a 5 Hz pulse train). A THz pyroelectric photodetector (Gentec QS9-THZ-BL) was mounted close to the polarizer without intermediate optics for power measurement. The voltage responsivity of the pyroelectric detector at THz frequency was calibrated using the output from a He—Ne laser (about 0.63 μm) that was mechanically chopped at 5 Hz and corrected by a wavelength-dependent factor. The peak power was obtained by converting the measured average power based on the effective duty cycle that considers the non-lasing time of about 180 ns in the beginning of each pulse duration (owing to the pulse instability at turn-on). The spectra measurement was performed by a Fourier-Transform Infra-Red (FTIR) spectrometer (Nicolet 8700), with the resolution of 0.25 cm$^{-1}$.

Beam Pattern Measurement

The measurement of the far-field beam pattern for the VECSEL was carried out by angular scans in two dimensions ($\theta_x$ and $\theta_y$ as specified in FIG. 3(a)) with the output coupler located at the center of the scanning setup. A pyroelectric detector was used for measurement and mounted at a distance of about 15 cm from the polarizer. The angular step is 0.5° in both directions.

As used herein, the singular terms "a," "an," and "the" include plural referents unless the context clearly dictates otherwise. Thus, for example, reference to an object can include multiple objects unless the context clearly dictates otherwise.

As used herein, the terms "substantially," "substantial," and "about" are used to describe and account for small variations. When used in conjunction with an event or circumstance, the terms can refer to instances in which the event or circumstance occurs precisely as well as instances in which the event or circumstance occurs to a close approximation. When used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a ratio in the range of about 1 to about 200 should be understood to include the explicitly recited limits of about 1 and about 200, but also to include individual ratios such as about 2, about 3, and about 4, and sub-ranges such as about 10 to about 50, about 20 to about 100, and so forth.

While the disclosure has been described with reference to the specific embodiments thereof, it should be understood by those skilled in the art that various changes may be made and equivalents may be substituted without departing from the true spirit and scope of the disclosure as defined by the appended claim(s). In addition, many modifications may be made to adapt a particular situation, material, composition of matter, method, operation or operations, to the objective, spirit and scope of the disclosure. All such modifications are intended to be within the scope of the claim(s) appended hereto. In particular, while certain methods may have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations is not a limitation of the disclosure.

What is claimed is:

1. A metasurface reflector for quantum cascade lasing, the metasurface reflector comprising:
    a substrate;
    an array of subcavities disposed on the substrate and spaced with a period, each of the subcavities comprising:
        a first metallic layer disposed on the substrate;
        a layer of quantum-cascade-laser-active material disposed on the first metallic layer; and
        a second metallic layer disposed on the layer of quantum-cascade-laser-active material;
    wherein the array of subcavities reflect an incident light of a resonant frequency with amplification,
    wherein the period of the array of subcavities is less than a wavelength of the incident light of the resonant frequency, and wherein the array of subcavities include a first group of subcavities and a second group of subcavities interlaced with each other, wherein the first group of subcavities selectively reflects first incident light of a first polarization state with amplification, wherein the second group of subcavities selectively reflects second incident light of a second polarization state with amplification, and wherein the first polarization state and the second polarization state are different.

2. The metasurface reflector of claim 1, wherein the substrate comprises a GaAs substrate.

3. The metasurface reflector of claim 1, wherein the layer of quantum-cascade-laser-active material comprises a GaAs/AlGaAs material system or a InGaAs/InAlAs material system.

4. The metasurface reflector of claim 1, wherein a gain peak of the layer of quantum-cascade-laser-active material is in a range of about 1 Terahertz (THz) to about 10 THz.

5. The metasurface reflector of claim 4, wherein the gain peak is in a range of about 2 THz to about 3 THz.

6. The metasurface reflector of claim 1, wherein a width of each subcavity substantially determines a cutoff of the resonant frequency.

7. The metasurface reflector of claim 1, wherein a width of each subcavity is in a range of about 10 micrometer (μm) to about 15 μm, and wherein a height of each subcavity is in a range of about 5 μm to about 20 μm.

8. The metasurface reflector of claim 1, wherein the period of the array is in a range of about 50 μm to about 100 μm.

9. The metasurface reflector of claim 1, wherein each subcavity tapers at edges of the metasurface reflector and terminates at an unbiased region of the metasurface reflector.

10. The metasurface reflector of claim 1, wherein a reflectance of the array of subcavities is more than unity (1) at a gain peak of the layer of quantum-cascade-laser-active material.

11. The metasurface reflector of claim 1, wherein the first polarization state is a linear polarization, a right-hand circular polarization, or a left-hand circular polarization.

12. The metasurface reflector of claim 1, wherein the second polarization state is a linear polarization, a right-hand circular polarization, or a left-hand circular polarization.

13. The metasurface reflector of claim 1, wherein the first polarization state and the polarization state are orthogonal to each other.

14. The metasurface reflector of claim 1, wherein each of the first group of subcavities includes a plurality of first connectors and a plurality of parallel first patches electrically connected by the plurality of first connectors, wherein each of the second group of subcavities includes a plurality of second connectors and a plurality of parallel second patches electrically connected by the plurality of second connectors, and wherein the first patches and the second patches have different orientations.

15. A quantum cascade laser comprising:
a metasurface reflector comprising:
a substrate;
an array of subcavities disposed on the substrate and spaced with a period, each of the subcavities comprising:
a first cladding layer disposed on the substrate;
a layer of quantum-cascade-laser-active material disposed on the first cladding layer; and
a second cladding layer disposed on the layer of quantum-cascade-laser-active material;
wherein the array of subcavities reflect an incident light of a resonant frequency with amplification,
wherein the period of the array of subcavities is less than a wavelength of the incident light of the resonant frequency, and
wherein the array of subcavities include a first group of subcavities and a second group of subcavities interlaced with each other, wherein the first group of subcavities selectively reflects first incident light of a first polarization state with amplification, wherein the second group of subcavities selectively reflects second incident light of a second polarization state with amplification, and wherein the first polarization state and the second polarization state are different; and
an output coupler coupled to the metasurface reflector which forms an external cavity with the metasurface reflector for generating a quantum cascade laser beam.

16. The quantum cascade laser of claim 15, wherein a reflectance of the metasurface reflector is more than unity (1) at a gain peak of the layer of quantum-cascade-laser-active material, and wherein the gain peak of the layer of quantum-cascade-laser-active material is in a range of about 1 Terahertz (THz) to about 10 THz.

17. The quantum cascade laser of claim 16, further comprising:
a heat sink that holds the metasurface reflector; and
a cryostat that houses the heat sink and the metasurface reflector, wherein the cryostat includes a window for transmission of the quantum cascade laser beam.

18. The quantum cascade laser of claim 15, wherein the output coupler is an external reflector, wherein the quantum cascade laser beam is reflected between the external reflector and the metasurface reflector before emitting.

19. The quantum cascade laser of claim 15, wherein the output coupler is a THz wire-grid polarizer, and wherein an output power of the quantum cascade laser is adjusted by varying a wire orientation angle on the THz wire-grid polarizer.

20. The quantum cascade laser of claim 15, wherein the external cavity is a plano-plano Fabry-Perot cavity, and wherein a configuration of the output coupler determines a spectrum of the quantum cascade laser beam.

21. The quantum cascade laser of claim 15, wherein the quantum cascade laser beam is a Gaussian mode laser beam with a divergence of about 4.3°×5.1° or lower.

22. The quantum cascade laser of claim 15, wherein the first polarization state and the polarization state are orthogonal to each other.

* * * * *